United States Patent
Zheleva et al.

(10) Patent No.: US 7,195,993 B2
(45) Date of Patent: Mar. 27, 2007

(54) METHODS OF FABRICATING GALLIUM NITRIDE SEMICONDUCTOR LAYERS BY LATERAL GROWTH INTO TRENCHES

(75) Inventors: Tsvetanka Zheleva, Chapel Hill, NC (US); Darren B. Thomson, Cary, NC (US); Scott A. Smith, Centerville, OH (US); Kevin J. Linthicum, Angier, NC (US); Thomas Gehrke, Carrboro, NC (US); Robert F. Davis, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 141 days.

(21) Appl. No.: 10/915,665

(22) Filed: Aug. 10, 2004

(65) Prior Publication Data

US 2005/0009304 A1    Jan. 13, 2005

Related U.S. Application Data

(60) Division of application No. 10/426,553, filed on Apr. 30, 2003, now Pat. No. 6,897,483, which is a continuation of application No. 09/870,820, filed on May 31, 2001, now abandoned, which is a continuation of application No. 09/327,136, filed on Jun. 7, 1999, now Pat. No. 6,265,289.

(60) Provisional application No. 60/088,761, filed on Jun. 10, 1998.

(51) Int. Cl.
    *H01L 21/36*    (2006.01)
(52) U.S. Cl. ............... 438/503; 438/478; 438/479
(58) Field of Classification Search ............ 438/503, 438/478, 479
    See application file for complete search history.

(56) References Cited

U.S. PATENT DOCUMENTS

| 4,127,792 A | 11/1978 | Nakata ................... 313/500 |
| 4,522,661 A | 6/1985 | Morrison et al. ......... 148/33.2 |
| 4,651,407 A | 3/1987 | Bencuya .................. 29/571 |
| 4,865,685 A | 9/1989 | Palmour ................. 156/643 |
| 4,876,210 A | 10/1989 | Barnett et al. .............. 437/5 |
| 4,912,064 A | 3/1990 | Kong et al. .............. 437/100 |
| 4,946,547 A | 8/1990 | Palmour et al. .......... 156/643 |

(Continued)

FOREIGN PATENT DOCUMENTS

CA    2258080    10/1998

(Continued)

OTHER PUBLICATIONS

Official Action with English language translation, JP 2000-553988, Jul. 29, 2005.

(Continued)

*Primary Examiner*—Laura M. Schillinger
(74) *Attorney, Agent, or Firm*—Myers Bigel Sibley & Sajovec, P.A.

(57) ABSTRACT

A gallium nitride layer is laterally grown into a trench in the gallium nitride layer, to thereby form a lateral gallium nitride semiconductor layer. At least one microelectronic device may then be formed in the lateral gallium nitride semiconductor layer. Dislocation defects do not significantly propagate laterally into the lateral gallium nitride semiconductor layer, so that the lateral gallium nitride semiconductor layer is relatively defect free.

10 Claims, 8 Drawing Sheets

U.S. PATENT DOCUMENTS

| | | | |
|---|---|---|---|
| 5,122,845 A | 6/1992 | Manabe et al. | 357/17 |
| 5,156,995 A | 10/1992 | Fitzgerald, Jr. et al. | 437/90 |
| RE34,861 E | 2/1995 | Davis et al. | 437/100 |
| 5,389,571 A | 2/1995 | Takeuchi et al. | 437/133 |
| 5,397,736 A | 3/1995 | Bauser et al. | 437/92 |
| 5,549,747 A | 8/1996 | Bozler et al. | 117/43 |
| 5,583,880 A | 12/1996 | Shakuda | 372/46 |
| 5,602,418 A | 2/1997 | Imai et al. | 257/627 |
| 5,710,057 A | 1/1998 | Kenney | 437/62 |
| 5,760,426 A | 6/1998 | Marx et al. | 257/190 |
| 5,786,606 A | 7/1998 | Nishio et al. | 257/103 |
| 5,798,537 A * | 8/1998 | Nitta | 257/103 |
| 5,815,520 A | 9/1998 | Furushima | 372/45 |
| 5,877,070 A | 3/1999 | Goesele et al. | 438/458 |
| 5,880,485 A | 3/1999 | Marx et al. | 257/94 |
| 5,912,477 A | 6/1999 | Negley | 257/95 |
| 5,915,194 A | 6/1999 | Powell et al. | 438/478 |
| 6,051,849 A * | 4/2000 | Davis et al. | 257/103 |
| 6,064,078 A | 5/2000 | Northrup et al. | 257/96 |
| 6,072,819 A | 6/2000 | Shakuda | 372/46 |
| 6,100,104 A | 8/2000 | Haerle | 438/33 |
| 6,100,111 A | 8/2000 | Konstantinov | 438/92 |
| 6,121,121 A | 9/2000 | Koide | 438/481 |
| 6,153,010 A | 11/2000 | Kiyoku et al. | 117/95 |
| 6,156,584 A | 12/2000 | Itoh et al. | 438/33 |
| 6,177,359 B1 * | 1/2001 | Chen et al. | 438/751 |
| 6,177,688 B1 * | 1/2001 | Linthicum et al. | 257/77 |
| 6,255,198 B1 * | 7/2001 | Linthicum et al. | 438/481 |
| 6,261,929 B1 * | 7/2001 | Gehrke et al. | 438/478 |
| 6,265,289 B1 * | 7/2001 | Zheleva et al. | 438/503 |
| 6,325,850 B1 | 12/2001 | Beaumont et al. | 117/95 |
| 6,376,339 B2 * | 4/2002 | Linthicum et al. | 438/479 |
| 6,380,108 B1 * | 4/2002 | Linthicum et al. | 438/791 |
| 6,403,451 B1 * | 6/2002 | Linthicum et al. | 438/479 |
| 6,462,355 B1 * | 10/2002 | Linthicum et al. | 257/77 |
| 6,486,042 B2 * | 11/2002 | Gehrke et al. | 438/462 |
| 6,489,221 B2 * | 12/2002 | Gehrke et al. | 438/479 |
| 6,521,514 B1 * | 2/2003 | Gehrke et al. | 438/479 |
| 6,545,300 B2 * | 4/2003 | Gehrke et al. | 257/190 |
| 6,586,778 B2 * | 7/2003 | Linthicum et al. | 257/103 |
| 6,602,764 B2 * | 8/2003 | Linthicum et al. | 438/481 |
| 6,617,261 B2 * | 9/2003 | Wong et al. | 438/778 |
| 6,621,148 B2 * | 9/2003 | Linthicum et al. | 257/623 |
| 6,686,261 B2 * | 2/2004 | Gehrke et al. | 438/478 |
| 6,849,864 B2 * | 2/2005 | Nagahama et al. | 257/22 |
| 6,864,160 B2 * | 3/2005 | Linthicum et al. | 438/479 |
| 6,897,483 B2 * | 5/2005 | Zheleva et al. | 257/77 |
| 7,095,062 B2 * | 8/2006 | Linthicum et al. | 257/103 |
| 2001/0007242 A1 | 7/2001 | Davis et al. | 117/104 |
| 2001/0008299 A1 * | 7/2001 | Linthicum et al. | 257/613 |
| 2001/0008791 A1 * | 7/2001 | Gehrke et al. | 438/481 |
| 2001/0039102 A1 * | 11/2001 | Zheleva et al. | 438/478 |
| 2001/0041427 A1 * | 11/2001 | Gehrke et al. | 438/481 |
| 2002/0013036 A1 * | 1/2002 | Gehrke et al. | 438/462 |
| 2002/0022287 A1 * | 2/2002 | Linthicum et al. | 438/46 |
| 2002/0031851 A1 * | 3/2002 | Linthicum et al. | 438/22 |
| 2002/0069816 A1 * | 6/2002 | Gehrke et al. | 117/84 |
| 2002/0110997 A1 * | 8/2002 | Linthicum et al. | 438/479 |
| 2002/0111044 A1 * | 8/2002 | Linthicum et al. | 438/797 |
| 2002/0148534 A2 * | 10/2002 | Davis et al. | 148/33 |
| 2002/0179911 A1 * | 12/2002 | Linthicum et al. | 257/77 |
| 2003/0092230 A1 * | 5/2003 | Koike et al. | 438/200 |
| 2003/0092263 A1 * | 5/2003 | Koike et al. | 438/689 |
| 2003/0114017 A1 * | 6/2003 | Wong et al. | 438/778 |
| 2003/0119239 A1 * | 6/2003 | Koike et al. | 438/200 |
| 2003/0134446 A1 * | 7/2003 | Koike et al. | 438/41 |
| 2003/0194828 A1 * | 10/2003 | Zheleva et al. | 438/71 |
| 2003/0207551 A1 * | 11/2003 | Gehrke et al. | 438/584 |
| 2004/0029365 A1 * | 2/2004 | Linthicum et al. | 438/481 |
| 2004/0152321 A1 * | 8/2004 | Gehrke et al. | 438/689 |
| 2004/0206978 A1 * | 10/2004 | Saxler | 257/190 |
| 2004/0224484 A1 * | 11/2004 | Fareed et al. | 438/478 |
| 2004/0251519 A1 * | 12/2004 | Sugahara et al. | 257/615 |
| 2005/0009304 A1 * | 1/2005 | Zheleva et al. | 438/478 |
| 2005/0161702 A1 * | 7/2005 | Linthicum et al. | 257/183 |

FOREIGN PATENT DOCUMENTS

| | | |
|---|---|---|
| EP | 0 551 721 A2 | 7/1993 |
| EP | 0 852 416 A1 | 7/1998 |
| EP | 0 884 767 A2 | 12/1998 |
| EP | 0 942 459 A1 | 9/1999 |
| EP | 0 951 055 A2 | 10/1999 |
| JP | 3-132016 | 6/1991 |
| JP | 4-188678 | 7/1992 |
| JP | 5-7016 | 1/1993 |
| JP | 5-41536 | 2/1993 |
| JP | 06163487 A * | 6/1994 |
| JP | 8-18159 | 1/1996 |
| JP | 08-064791 | 3/1996 |
| JP | 8-116093 | 5/1996 |
| JP | 8-125251 | 5/1996 |
| JP | 8-153931 | 6/1996 |
| JP | 9-93315 | 4/1997 |
| JP | 9-174494 | 6/1997 |
| JP | 9-181071 | 7/1997 |
| JP | 9-201477 | 7/1997 |
| JP | 9-277448 | 10/1997 |
| JP | 9-290098 | 10/1997 |
| JP | 9-324997 | 11/1997 |
| JP | 11-145516 | 5/1999 |
| JP | 11-251631 A | 9/1999 |
| JP | 11-312825 A | 11/1999 |
| WO | WO 97/11518 | 3/1997 |
| WO | WO 98/47170 | 10/1998 |
| WO | WO 99/18617 | 4/1999 |
| WO | WO 99/44224 | 9/1999 |

OTHER PUBLICATIONS

Akasaki et al., *Effects of AlN Buffer Layer on Crystallographic Structure and on Electrical and Optical Properties of GaN and $Ga_{1-x}Al_xN(0<x\leq0.4)$ Films Grown on Sapphire Substrate by MOVPE*, Journal of Crystal Growth, vol. 98, 1989, pp. 209-219.

Allegretti et al., *In-situ Observation of GaAs Selective Epitaxy on GaAs (1 1 1)B Substrates*, Journal of Crystal Growth, vol. 146, 1995, pp. 354-358.

Allegretti et al., *Periodic Supply Epitaxy: A New Approach for the Selective Area Growth of GaAs by Molecular Beam Epitaxy*, Journal of Crystal Growth, vol. 156, 1995, pp. 1-10.

Amano et al., *Metalorganic Vapor Phase Epitaxial Growth of a High Quality GaN Film Using an AlN Buffer Layer*, Applied Physics Letters, vol. 48, No. 5, Feb. 3, 1986, pp. 353-355.

Boo et al., *Growth of Hexagonal GaN Thin Films on Si(1 1 1) with Cubic SiC Buffer Layers*, Journal of Crystal Growth 189-190, 1998, pp. 183-188.

Chen et al., *Dislocation Reduction in GaN Thin Films Via Lateral Overgrowth From Trenches*, Applied Physics Letters, vol. 75, No. 14, Oct. 4, 1999, pp. 2062-2063.

Chen et al., *Silicon-on-Insulator: Why, How, and When*, AIP Conference Proceedings, vol. 167, No. 1, Sep. 15, 1988, pp. 310-319.

Doverspike et al., *The Effect of GaN and AlN Buffer Layers on GaN Film Properties Grown on Both C-Plane and A-Plane Sapphire*, Journal of Electronic Materials, vol. 24, No. 4, 1995, pp. 269-273.

*Gallium Nitride-2000-Technology, Status, Applications, and Market Forecasts*, Strategies Unlimited, Report SC-23, May 2000.

Gehrke et al., *Pendeo-Epitaxial Growth of Gallium Nitride on Silicon Substrates*, Journal of Electronic Materials, vol. 29, No. 3, Mar. 2000, pp. 306-310.

Gehrke et al., *Pendeo-Epitaxial Growth of Gallium Nitride and Aluminum Nitride Films and Heterostructures on Silicon Carbide Substrate*, MRS Internet J. Semicond. Res. 4S1, G3.2, 1999, 6 pp.

Givargizov, *Other Approaches to Oriented Crystallization on Amorphous Substrates*, Chapter 4, Oriented Crystallization on Amorphous Substrates, Plenum Press, 1991, pp. 221-264.

Gustafsson et al., *Investigations of High Quality $Ge_xSi_{1-x}$ Grown by Heteroepitaxial Lateral Overgrowth Using Cathoduluminescence*, Inst. Phys. Conf. Ser. No. 134: Section 11, Micros. Semicond. Mater. Conf., Oxford, Apr. 5-8, 1993, pp. 675-678.

Hiramatsu et al., *Growth Mechanism of GaN Grown on Sapphire With AlN Buffer Layer by MOVPE*, Journal of Crystal Growth, vol. 115, 1991, pp. 628-633.

Hiramatsu et al., *Selective Area Growth and Epitaxial Lateral Overgrowth of GaN*, Properties, Processing and Applications of Gallium Nitride and Related Semiconductors, EMIS Datareviews Series No. 23, 1998, pp. 440-446.

Honda et al., *Selective Area Growth of GaN Microstructures on Patterned (1 1 1) and (001) Si Substrates*, 4th European Workshop on GaN, Nottingham, UK, Jul. 2-5, 2000.

International Search Report, PCT/US00/27354, Jan. 24, 2001.
International Search Report, PCT/US00/40724, Feb. 27, 2001.
International Search Report, PCT/US99/04346, Jun. 9, 1999.
International Search Report, PCT/US99/12967, Oct. 18, 1999.
International Search Report, PCT/US99/27358, Apr. 28, 2000.
International Search Report, PCT/US99/28056, Apr. 26, 2000.

Ishiwara et al., *Lateral Solid Phase Epitaxy of Amorphous Si Films on Si Substrates With $SiO_2$ Patterns*, Applied Physics Letters, vol. 43, No. 11, Dec. 1, 1983, pp. 1028-1030.

Jastrzebski, *SOI by CVD: Epitaxial Lateral Overgrowth (ELO) Process-Review*, Journal of Crystal Growth, vol. 63, 1983, pp. 493-526.

Joyce et al., *Selective Epitaxial Deposition of Silicon*, Nature, vol. 4840, Aug. 4, 1962, pp. 485-486.

Kapolnek et al., "*Anisotropic Epitaxial Lateral Growth in GaN Selective Area Epitaxy*", Appl. Phys. Lett. 71 (9), Sep. 1, 1997, pp. 1204-1206.

Kapolnek et al., "*Selective Area Epitaxy of GaN for Electron Field Emission Devices*", Journal of Crystal Growth, 5451, 1996, pp. 1-4.

Kato et al., "*Selective Growth of Wurtzite GaN and $Al_xGa_{1-x}N$ on GaN/Sapphire Substrates by Metalorganic Vapor Phase Epitaxy*", Journal of Crystal Growth, 144, 1994, pp. 133-140.

Kinoshita et al., *Epitaxial Lateral Overgrowth of Si on Non-Planar Substrate*, Journal of Crystal Growth, vol. 115, 1991, pp. 561-566.

Kuznia et al., *Influence of Buffer Layers on the Deposition of High Quality Single Crystal GaN Over Sapphire Substrates*, J. Appl. Phys., vol. 73, No. 9, May 1, 1993, pp. 4700-4702.

*Leo Unmasked by Pendeo-Epitaxy*, Compound Semiconductor, Mar. 1999, p. 16.

Linthicum et al., *Pendeoepitaxy of Gallium Nitride Thin Films*, Applied Physics Letters, vol. 75, No. 2, Jul. 12, 1999, pp. 196-198.

Linthicum et al., *Process Routes for Low-Defect Density GaN on Various Substrates Employing Pendeo-Epitaxial Growth Techniques*, MRS Internet Journal of Nitride Semiconductor Research, Fall Meeting of the Materials Research Society, vol. 4SI, No. G4.9, Nov. 30, 1998-Dec. 4, 1998.

Mahajan et al., *Principles of Growth and Processing of Semiconductors*, WCB McGraw-Hill, 1999, pp. 268-275, 352-365.

Marchand et al., *Microstructure of GaN Laterally Overgrown by Metalorganic Chemical Vapor Deposition*, Applied Physics Letters, vol. 73, No. 6, Aug. 10, 1998, pp. 747-749.

Molnar et al., *Growth of Gallium Nitride by Hydride Vapor-Phase Epitaxy*, Journal of Crystal Growth, vol. 178, 1997, pp. 147-156.

Nakamura et al., *High-Power, Long-Lifetime InGaN/GaN/AlGaN-Based Laser Diodes Grown on Pure GaN Substrates*, Jpn. J. Appl. Phys., vol. 37, Mar. 15, 1998, pp. L309-L312.

Nakamura et al., *InGaN/GaN/AlGaN-Based Laser Diodes Grown on GaN Substrates With a Fundamental Transverse Mode*, Jpn. J. Appl. Phys., vol. 37, Sep. 15, 1998, pp. L1020-L1022.

Nakamura et al., *InGaN/GaN/AlGaN-Based Laser Diodes With Modulation-Doped Strained-Layer Superlattices*, Jpn. J. Appl. Phys., vol. 36, Dec. 1, 1997, pp. L1568-L1571.

Nakamura et al., *Violet InGaN/GaN/AlGaN-Based Laser Diodes Operable at 50 °C With a Fundamental Transverse Mode*, Jpn. J. Appl. Phys. vol. 38, Part 1, No. 3A, Mar. 1, 1999, pp. L226-L229.

Nakamura, *GaN Growth Using GaN Buffer Layer*, Japanese Journal of Applied Physics, vol. 30, No. 10A, Oct. 1991, pp. L1705-L1707.

Nakamura, *InGaN/GaN/AlGaN-Based Laser Diodes*, Properties, Processing and Applications of Gallium Nitride and Related Semiconductors, EMIS Datareviews Series No. 23, 1998, pp. 587-595.

Nakamura, *InGaN-Based Violet Laser Diodes*, Semicond. Sci. Technol., 14, 1999, pp. R27-R40.

Nam et al., "*Selective Growth of GaN and $Al_{0.2}Ga_{0.8}N$ on GaN/AlN/6H-SiC(0001) Multilayer Substrates Via Organometallic Vapor Phase Epitaxy*", Proceedings MRS, Dec. 1996, 6 pp.

Nam et al., *Lateral Epitaxial Overgrowth of GaN Films on $SiO_2$ Areas Via Metalorganic Vapor Phase Epitaxy*, Journal of Electronic Materials, vol. 27, No. 4, 1998, pp. 233-237.

Nam et al., *Lateral Epitaxy of Low Defect Density GaN Layers Via Organometallic Vapor Phase Epitaxy*, Appl. Phys. Lett., vol. 71, No. 18, Nov. 3, 1997, pp. 2638-2640.

Nam, et al., "*Growth of GaN and $Al_{0.2}Ga_{0.8}N$ on Patterned Substrates Via Organometallic Vapor Phase Epitaxy*", Jpn. J. Appl. Phys., vol. 36, Part 2, No. 5A, May 1, 1997, pp. 532-535.

Naritsuka et al., *Epitaxial Lateral Overgrowth of InP by Liquid Phase Epitaxy*, Journal of Crystal Growth, vol. 146, 1995, pp. 314-318.

Nishinaga et al., *Epitaxial Lateral Overgrowth of GaAs by LPE*, Japanese Journal of Applied Physics, vol. 27, No. 6, Jun. 1988, pp. L964-L967.

Rathman et al., *Lateral Epitaxial Overgrowth of Silicon on $SiO_2$*, Journal of the Electrochemical Society, Oct. 1982, pp. 2303-2306.

Sakai et al., *Transmission Electron Microscopy of Defects in GaN Films Formed by Epitaxial Lateral Overgrowth*, vol. 73, No. 4, Jul. 27, 1998, pp. 481-483.

Sakai, *Defect Structure in Selectively Grown GaN Films With Low Threading Dislocation Density*, Appl. Phys. Lett., vol. 71, No. 16, Oct. 20, 1997, pp. 2259-2261.

Sakawa et al., *Effect of Si Doping on Epitaxial Lateral Overgrowth of GaAs on GaAs-Coated Si Substrate*, Japanese Journal of Applied Physics, Part 2, No. 3B, Mar. 15, 1992, pp. L359-L361.

Shaw, *Selective Epitaxial Deposition of Gallium Arsenide in Holes*, Journal of the Electrochemical Society, Sep. 1966, pp. 904-908.

Steckl et al., *SiC Rapid Thermal Corbonization of the (1 1 1) Si Semiconductor-on-Insulator Structure and Subsequent Metalorganic Chemical Vapor Deposition*, Appl. Phys. Let., 69 (15), Oct. 7, 1996, pp. 2264-2266.

Sugiura, *Dislocation Motion in GaN Light-Emitting Devices and Its Effect on Device Lifetime*, J. Appl. Physics, vol. 81, No. 4, Feb. 15, 1997, pp. 1633-1638.

Suzuki et al., *Epitaxial Lateral Overgrowth of Si by LPE With Sn Solution and Its Orientation Dependence*, Japanese Journal of Applied Physics, vol. 28, No. 3, Mar. 1989, pp. 440-445.

Suzuki et al., *Si LPE Latreal Overgrowth From a Ridge Seed*, Japanese Journal of Applied Physics, vol. 29, No. 12, Dec. 1990, pp. 2685-2689.

Suzuki et al., *The Sources of Atomic Steps in Epitaxial Lateral Overgrowth of Si*, Journal of Crystal Growth, vol. 99, 1989, pp. 229-234.

Tausch, Jr. et al., *A Novel Crystal Growth Phenomenon: Single Crystal GaAs Overgrowth Onto Silicon Dioxide*, Journal of the Electrochemical Society, Jul. 1965, pp. 706-709.

Thomson et al., *Ranges of Deposition Temperatures Applicable for Metalorganic Vapor Phase Epitaxy of GaN Films Via the Technique of Pendeo-Epitaxy*, MRS Internet J. Semicond. Res. 4S1, G3.37, 1999, 6 pp.

Tu et al., *Electronic Thin Film Science*, MacMillan Publishing Company, 1992, pp. 46-73, 184-187.

Ujiie et al., *Epitaxial Growth of GaAs on a Si Substrate*, Jpn. J. Appl. Phys., vol. 28, 1989, p. L337-L339.

Usui et al., "*Thick GaN Epitaxial Growth With Low Dislocation Density by Hydride Vapor Phase Epitaxy*", Jpn. J. Appl. Phys., vol. 36, Part 2, No. 7B, Jul. 15, 1997, pp. 899-902.

Watanabe et al., *The Growth of Single Crystalline GaN on a Si Substrate Using AlN As An Intermediate Layer*, Journal of Crystal Growth, vol. 128, 1993, pp. 391-396.

Weeks et al, "*GaN Thin Films Deposited Via Organometallic Vapor Phase Epitaxy on $\alpha(6H)$-SiC(0001) Using High-Temperature Monocrystalline AlN Buffer Layers*", Appl. Phys. Lett. 67 (3), Jul. 17, 1995, pp. 401-403.

Wolf et al., *Silicon Processing for the VLSI Era*, vol. 1 *Process Technology*, Lattice Press, 1986, 36-44.

Wu et al., *Growth and Characterization of SiC Films on Large-Area Si Wafers by APCVD-Temperature Dependence*, Materials Science Forum, vols. 264-268, 1998, pp. 179-182.

Yamaguchi et al., "*Lateral Supply Mechanisms in Selective Metalorganic Chemical Vapor Deposition*", Jpn. Appl. Phys., vol. 32 (1993), pp. 1523-1527.

Yoshida et al., *Improvements on the Electrical and Luminescent Properties of Reactive Molecular Beam Epitaxially Grown GaN Films by Using AlN-Coated Sapphire Substrates*, Applied Physics Letters, vol. 42, No. 5, Mar. 1, 1983, pp. 427-429.

Zeng et al., *Optical Properties of GaN Pyramids*, Applied Physics Letters, vol. 74, No. 9, Mar. 1, 1999, pp. 1227-1229.

Zhang et al., *Epitaxial Lateral Overgrowths of GaAs on (001) GaAs Substrates by LPE: Growth Behavior and Mechanism*, Journal of Crystal Growth, vol. 99, 1990, pp. 292-296.

Zhang et al., *LPE Lateral Overgrowth of GaP*, Japanese Journal of Applied Physics, vol. 29, No. 3, Mar. 1990, pp. 545-550.

Zheleva et al., *Dislocation Density Reduction Via Lateral Epitaxy in Selectively Grown GaN Structures*, Appl. Phys. Lett., vol. 71, No. 17, Oct. 27, 1997, pp. 2472-2474.

Zheleva et al., *Pendeo-Epitaxy: A New Approach for Lateral Growth of Gallium Nitride Films*, Journal of Electronic Materials, vol. 28, No. 4, Feb. 1999, pp. L5-L8.

Zheleva et al., *Pendeo-Epitaxy—A New Approach for Lateral Growth of GaN Structures*, MRS Internet Journal of Nitride Semiconductor Research, 1999, Online!, vol. 4S1, No. G3.38, Nov. 30, 1998-Dec. 4, 1998.

Davis et al., U.S. Appl. No. 09/031,843, filed Feb. 27, 1998, entitled *Methods of Fabricating Gallium Nitride Semiconductor Layers by Lateral Overgrowth Through Offset Masks, and Gallium Nitride Semiconductor Structures Fabricated Thereby*.

\* cited by examiner

METHODS OF FABRICATING GALLIUM NITRIDE SEMICONDUCTOR LAYERS BY LATERAL GROWTH INTO TRENCHES

CROSS-REFERENCE

This application is a divisional of application Ser. No. 10/426,553, filed Apr. 30, 2003, now U.S. Pat. No. 6,897,483 entitled *Method of Fabricating Gallium Nitride Semiconductor Layers by Lateral Growth Into Trenches, and Gallium Nitride Semiconductor Structures Fabricated Thereby*, which is a continuation of application Ser. No. 09/870,820, filed May 31, 2001 now abandoned, entitled *Methods of Fabricating Gallium Nitride Semiconductor Layers By Lateral Growth From Sidewalls Into Trenches, and Gallium Nitride Semiconductor Structures Fabricated Thereby*, which itself is a continuation of application Ser. No. 09/327,136, filed Jun. 7, 1999, now U.S. Pat. No. 6,265,289 entitled *Methods of Fabricating Gallium Nitride Semiconductor Layers by Lateral Growth From Sidewalls Into Trenches, and Gallium Nitride Semiconductor Structures Fabricated Thereby*, which claims the benefit of Provisional Application Ser. No. 60/088,761, filed Jun. 10, 1998, entitled *Methods of Fabricating Gallium Nitride Semiconductor Layers by Lateral Growth From Sidewalls Into Trenches, and Gallium Nitride Semiconductor Structures Fabricated Thereby*, the disclosures of all of which are hereby incorporated herein by reference in their entirety.

FEDERALLY SPONSORED RESEARCH

This invention was made with Government support under Office of Naval Research Contract No. N00014-96-1-0765. The Government may have certain rights to this invention.

FIELD OF THE INVENTION

This invention relates to microelectronic devices and fabrication methods, and more particularly to gallium nitride semiconductor devices and fabrication methods therefor.

BACKGROUND OF THE INVENTION

Gallium nitride is being widely investigated for microelectronic devices including but not limited to transistors, field emitters and optoelectronic devices. It will be understood that, as used herein, gallium nitride also includes alloys of gallium nitride such as aluminum gallium nitride, indium gallium nitride and aluminum indium gallium nitride.

A major problem in fabricating gallium nitride-based microelectronic devices is the fabrication of gallium nitride semiconductor layers having low defect densities. It is known that one contributor to defect density is the substrate on which the gallium nitride layer is grown. Accordingly, although gallium nitride layers have been grown on sapphire substrates, it is known to reduce defect density by growing gallium nitride layers on aluminum nitride buffer layers which are themselves formed on silicon carbide substrates. Notwithstanding these advances, continued reduction in defect density is desirable.

It is also known to fabricate gallium nitride structures through openings in a mask. For example, in fabricating field emitter arrays, it is known to selectively grow gallium nitride on stripe or circular patterned substrates. See, for example, the publications by Nam et al. entitled "*Selective Growth of GaN and $Al_{0.2}Ga_{0.8}N$ on GaN/AlN/6H—SiC Multilayer Substrates Via Organometallic Vapor Phase Epitaxy*", Proceedings of the Materials Research Society, December 1996, and "*Growth of GaN and $Al_{0.2}Ga_{0.8}N$ on Patterned Substrates via Organometallic Vapor Phase Epitaxy*". Japanese Journal of Applied Physics., Vol. 36, Part 2, No. 5A, May 1997, pp. L532–L535. As disclosed in these publications, undesired ridge growth or lateral overgrowth may occur under certain conditions.

SUMMARY OF THE INVENTION

It is therefore an object of the present invention to provide improved methods of fabricating gallium nitride semiconductor layers, and improved gallium nitride layers so fabricated.

It is another object of the invention to provide methods of fabricating gallium nitride semiconductor layers that can have low defect densities, and gallium nitride semiconductor layers so fabricated.

These and other objects are provided, according to the present invention, by laterally growing a gallium nitride layer into a trench in the gallium nitride layer, to thereby form a lateral gallium nitride semiconductor layer. One or more microelectronic devices may then be formed in the lateral gallium nitride semiconductor layer. It has been found, according to the present invention, that dislocation defects do not significantly propagate laterally into the lateral gallium nitride semiconductor layer, so that the lateral gallium nitride semiconductor layer is relatively defect free.

The lateral gallium nitride semiconductor layer may be laterally grown using metalorganic vapor phase epitaxy (MOVPE). For example, the lateral gallium nitride layer may be laterally grown using triethylgallium (TEG) and ammonia ($NH_3$) precursors at 1000–1100° C. and 45 Torr. Preferably, TEG at 13–39 μmol/min and $NH_3$ at 1500 sccm are used in combination with 3000 sccm $H_2$ diluent. Most preferably, TEG at 26 μmol/min, $NH_3$ at 1500 sccm and $H_2$ at 3000 sccm at a temperature of 1100° C. and 45 Torr are used. The gallium nitride layer preferably is formed on a substrate such as 6H—SiC(0001), which itself includes a buffer layer such as aluminum nitride thereon. Other substrates such as sapphire, and other buffer layers such as low temperature gallium nitride, may be used. Multiple substrate layers and buffer layers also may be used.

The gallium nitride layer including the trench may be formed by forming a trench in a gallium nitride layer. Alternatively, the trench may be formed by forming a post on the gallium nitride layer, the post defining the trench. A series of alternating trenches and posts is preferably formed. Trenches and/or posts may be formed by selective etching, selective epitaxial growth, combinations of etching and growth, or other techniques. The trenches may extend into the buffer layer and into the substrate.

The gallium nitride layer is laterally grown into the trench, to thereby form the lateral gallium nitride semiconductor layer of lower defect density than the defect density of the gallium nitride layer. Some vertical growth may also occur. The laterally grown gallium nitride semiconductor layer is vertically grown while propagating the lower defect density. Vertical growth may also take place simultaneous with the lateral growth.

Gallium nitride semiconductor structures according to the invention comprise a gallium nitride layer including a trench, and a lateral gallium nitride layer that extends into the trench. A vertical gallium nitride layer extends from the lateral gallium nitride layer. At least one microelectronic device is included in the vertical gallium nitride layer. A series of alternating trenches and posts may be provided. The gallium nitride layer includes a predetermined defect density, and the lateral gallium nitride layer is of lower defect density than the predetermined defect density.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or "onto" another element, it can be directly on the other element or intervening elements may also be present. Moreover, each embodiment described and illustrated herein includes its complementary conductivity type embodiment as well.

Figure 1:
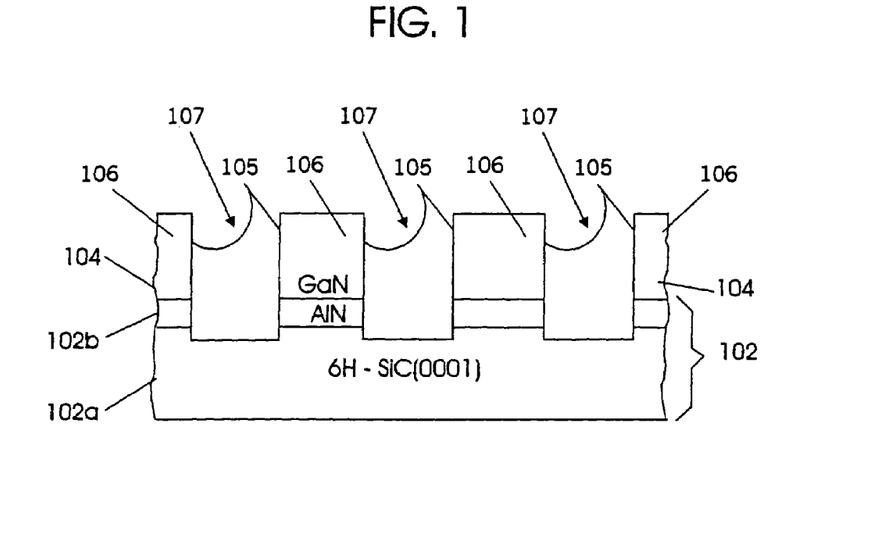
FIGS. 1–5 are cross-sectional views of first embodiments of gallium nitride semiconductor structures during intermediate fabrication steps according to the present invention.

Referring now to FIGS. 1–5, methods of fabricating gallium nitride semiconductor structures according to a first embodiment of the present invention will now be described. As shown in FIG. 1, an underlying gallium nitride layer 104 is grown on a substrate 102. The substrate 102 may include a 6H—SiC(0001) substrate 102a and an aluminum nitride buffer layer 102b. The crystallographic designation conventions used herein are well known to those having skill in the art, and need not be described further. The gallium nitride layer 104 may be between 1.0 and 2.0 µm thick, and may be grown at 1000° C. on a high temperature (1100° C.) aluminum nitride buffer layer 102b that was deposited on the 6H—SiC substrate 102a in a cold wall vertical and inductively heated metalorganic vapor phase epitaxy system using triethylgallium at 26 µmol/min, ammonia at 1500 sccm and 3000 sccm hydrogen diluent. Additional details of this growth technique may be found in a publication by T. W. Weeks et al. entitled "GaN Thin Films Deposited Via Organometallic Vapor Phase Epitaxy on α(6H)—SiC(0001) Using High-Temperature Monocrystalline AlN Buffer Layers", Applied Physics Letters, Vol. 67, No. 3, Jul. 17, 1995, pp. 401–403, the disclosure of which is hereby incorporated herein by reference. Other substrates, with or without buffer layers, may be used.

Still referring to FIG. 1, the underlying gallium nitride layer 104 includes a plurality of sidewalls 105 therein. It will be understood by those having skill in the art that the sidewalls 105 may be thought of as being defined by a plurality of spaced apart posts 106, that also may be referred to as "mesas", "pedestals" or "columns". The sidewalls 105 may also be thought of as being defined by a plurality of trenches 107, also referred to as "wells" in the underlying gallium nitride layer 104. The sidewalls 105 may also be thought of as being defined by a series of alternating trenches 107 and posts 106. It will be understood that the posts 106 and the trenches 107 that define the sidewalls 105 may be fabricated by selective etching and/or selective epitaxial growth and/or other conventional techniques. Moreover, it will also be understood that the sidewalls need not be orthogonal to the substrate 102, but rather may be oblique thereto. Finally, it will also be understood that although the sidewalls 105 are shown in cross-section in FIG. 1, the posts 106 and trenches 107 may define elongated regions that are straight, V-shaped or have other shapes. As shown in FIG. 1, the trenches 107 may extend into the buffer layer 102b and into the substrate 102a, so that subsequent gallium nitride growth occurs preferentially on the sidewalls 105 rather than on the trench floors. In other embodiments, the trenches may not extend into the substrate 102a, and also may not extend into buffer layer 102b, depending, for example, on the trench geometry and the lateral versus vertical growth rates of the gallium nitride.

Figure 2:
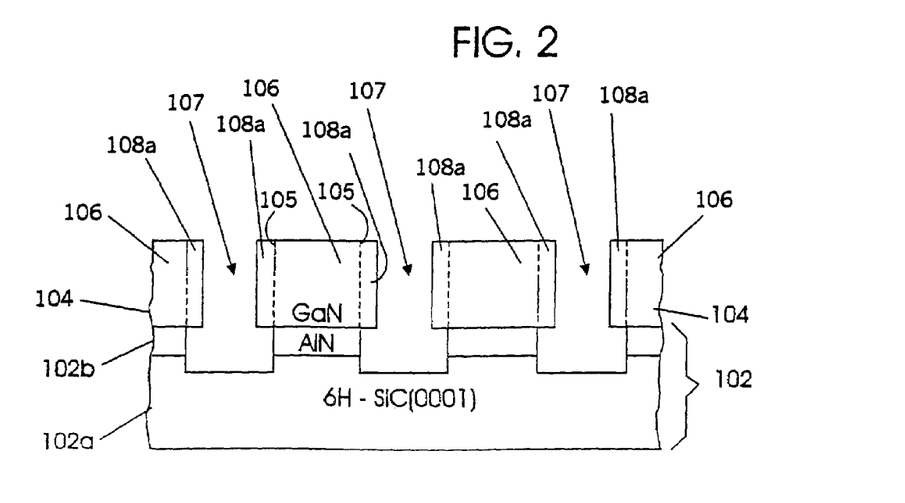

Referring now to FIG. 2, the sidewalls 105 of the underlying gallium nitride layer 104 are laterally grown to form a lateral gallium nitride layer 108a in the trenches 107. Lateral growth of gallium nitride may be obtained at 1000–1100° C. and 45 Torr. The precursors TEG at 13–39 µmol/min and NH$_3$ at 1500 sccm may be used in combination with a 3000 sccm H$_2$ diluent. If gallium nitride alloys are formed, additional conventional precursors of aluminum or indium, for example, may also be used. As used herein, the term "lateral" means a direction that is orthogonal to the sidewalls 105. It will also be understood that some vertical growth on the posts 106 may also take place during the lateral growth from sidewalls 105. As used herein, the term "vertical" denotes a directional parallel to the sidewalls 105.

Figure 3:
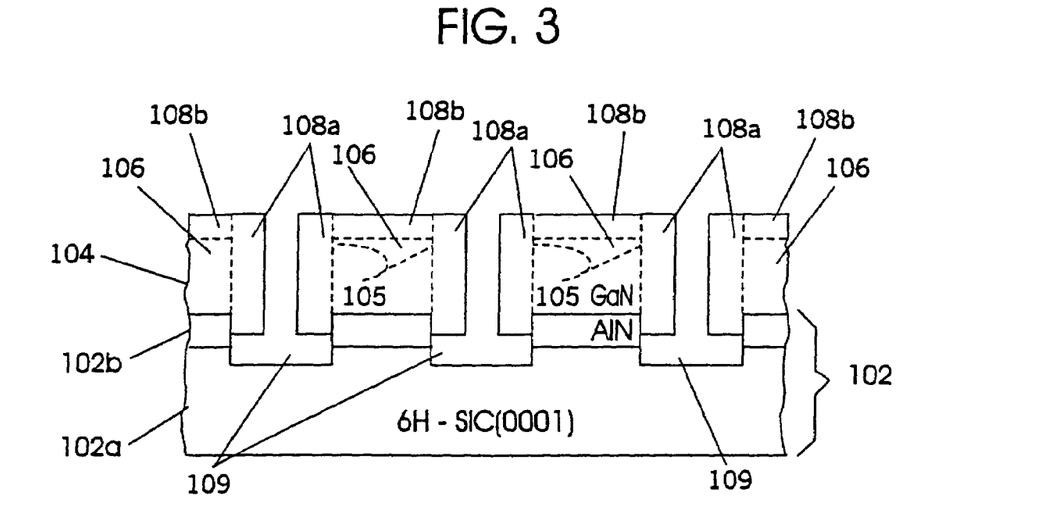

Referring now to FIG. 3, continued growth of the lateral gallium nitride layer 108a causes vertical growth onto the underlying gallium nitride layer 104, specifically onto the posts 106, to form a vertical gallium nitride layer 108b. Growth conditions for vertical growth may be maintained as was described in connection with FIG. 2. As also shown in FIG. 3, continued vertical growth into trenches 107 may take place at the bottom of the trenches.

Figure 4:
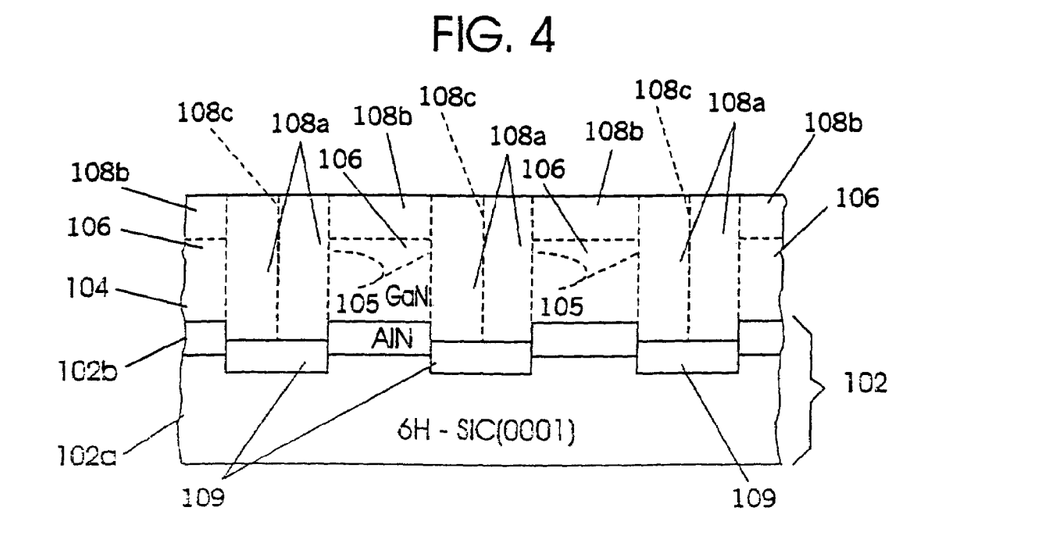
Figure 5:
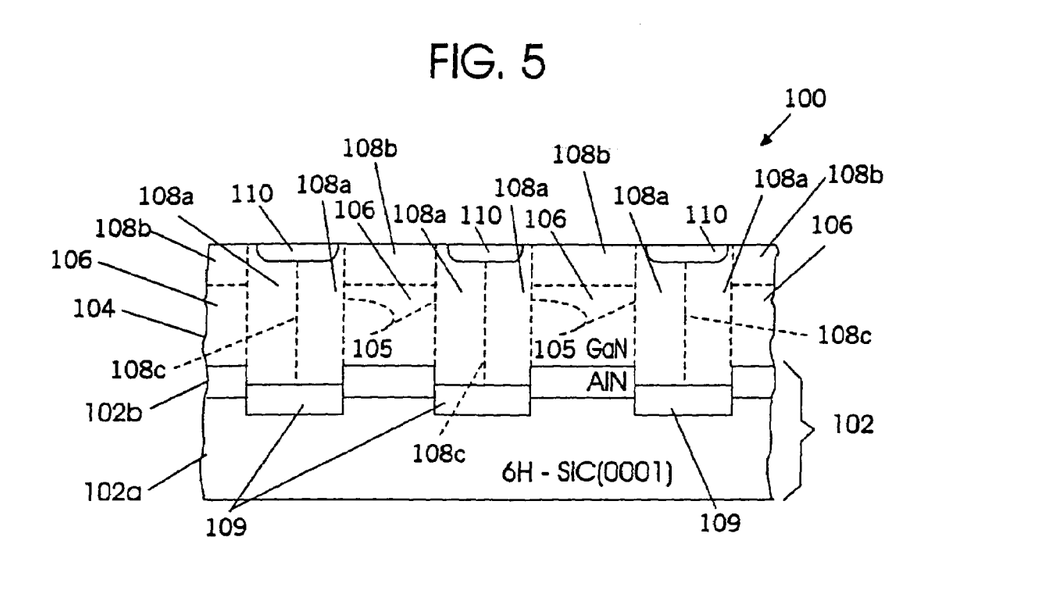
Figure 6:
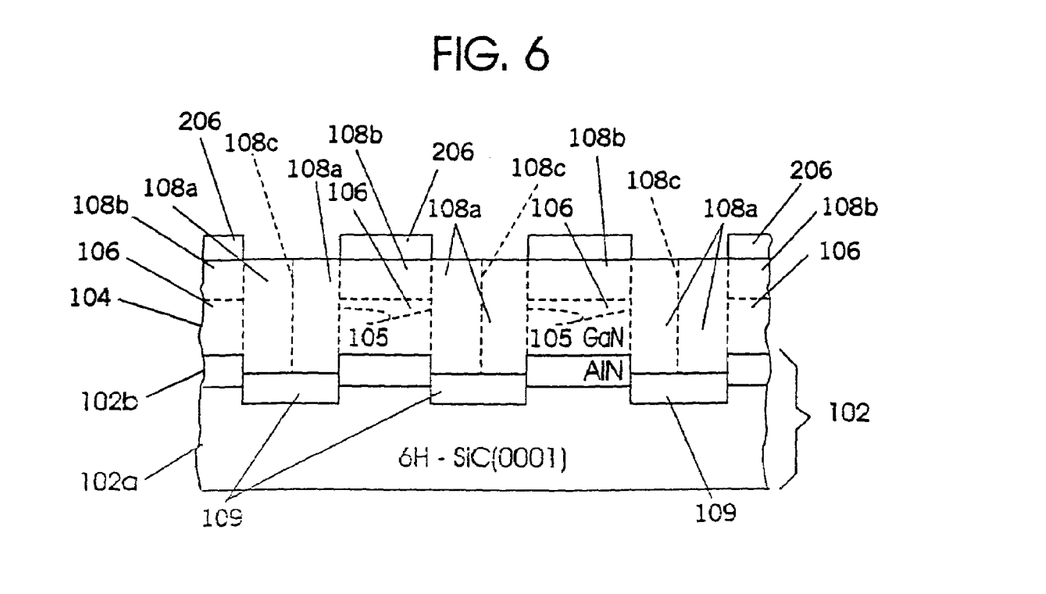
FIGS. 6–10 are cross-sectional views of second embodiments of gallium nitride semiconductor structures during intermediate fabrication steps according to the present invention.

Referring now to FIG. 4, growth is allowed to continue until the lateral growth fronts coalesce in the trenches 107 at the interfaces 108c, to form a continuous gallium nitride semiconductor layer in the trenches. The total growth time may be approximately 60 minutes. As shown in FIG. 5, microelectronic devices 110 may then be formed in the lateral gallium nitride semiconductor layer 108a. Devices may also be formed in vertical gallium nitride layer 108b.

Accordingly, in FIG. 5, gallium nitride semiconductor structures 100 according to a first embodiment of the present invention are illustrated. The gallium nitride structures 100 include the substrate 102. The substrate may be sapphire or gallium nitride or other conventional substrates. However, preferably, the substrate includes the 6H—SiC(0001) substrate 102a and the aluminum nitride buffer layer 102b on the silicon carbide substrate 102a. The aluminum nitride buffer layer 102b may be 0.1 µm thick.

The fabrication of the substrate 102 is well known to those having skill in the art and need not be described further. Fabrication of silicon carbide substrates are described, for example, in U.S. Pat. No. 4,865,685 to Palmour; Re U.S.

Pat. No. 34,861 to Davis et al.; U.S. Pat. No. 4,912,064 to Kong et al. and U.S. Pat. No. 4,946,547to Palmour et al., the disclosures of which are hereby incorporated herein by reference.

The underlying gallium nitride layer 104 is also included on the buffer layer 102b opposite the substrate 102a. The underlying gallium nitride layer 104 may be between about 1.0 and 2.0 µm thick, and may be formed using metalorganic vapor phase epitaxy (MOVPE). The underlying gallium nitride layer generally has an undesired relatively high defect density. For example, dislocation densities of between about $10^8$ and $10^{10}$ cm$^{-2}$ may be present in the underlying gallium nitride layer. These high defect densities may result from mismatches in lattice parameters between the buffer layer 102b and the underlying gallium nitride layer 104, and/or other causes. These high defect densities may impact the performance of microelectronic devices formed in the underlying gallium nitride layer 104.

Still continuing with the description of FIG. 5, the underlying gallium nitride layer 104 includes the plurality of sidewalls 105 that may be defined by the plurality of pedestals 106 and/or the plurality of trenches 107. As was described above, the sidewalls may be oblique and of various elongated shapes.

Continuing with the description of FIG. 5, the lateral gallium nitride layer 108a extends from the plurality of sidewalls 105 of the underlying gallium nitride layer 104. The lateral gallium nitride layer 108a may be formed using metalorganic vapor phase epitaxy at about 1000–1100° C. and 45 Torr. Precursors of triethygallium (TEG) at 13–39 µmol/min and ammonia (NH$_3$) at 1500 sccm may be used in combination with a 3000 sccm H$_2$ diluent, to form the lateral gallium nitride layer 108a.

Still continuing with the description of FIG. 5, the gallium nitride semiconductor structure 100 also includes the vertical gallium nitride layer 108b that extends vertically from the posts 106.

As shown in FIG. 5, the lateral gallium nitride layer 108a coalesces at the interfaces 108c to form a continuous lateral gallium nitride semiconductor layer 108a in the trenches. It has been found that the dislocation densities in the underlying gallium nitride layer 104 generally do not propagate laterally from the sidewalls 105 with the same density as vertically from the underlying gallium nitride layer 104. Thus, the lateral gallium nitride layer 108a can have a relatively low defect density, for example less that $10^4$ cm$^{-2}$. Accordingly, the lateral gallium nitride layer 108b may form device quality gallium nitride semiconductor material. Thus, as shown in FIG. 5, microelectronic devices 110 may be formed in the lateral gallium nitride semiconductor layer 108a. It will also be understood that a mask need not be used to fabricate the gallium nitride semiconductor structures 100 of FIG. 5, because lateral growth is directed from the sidewalls 105.

Referring know to FIGS. 6–10, second embodiments of gallium nitride semiconductor structures and fabrication methods according to the present invention will now be described. First, gallium nitride semiconductor structures of FIG. 4 are fabricated as was already described with regard to FIGS. 1–4. Then, referring to FIG. 6, the posts 106 are masked with a mask 206 that includes an array of openings therein. The mask may comprise silicon dioxide at thickness of 1000 Å and may be deposited using low pressure chemical vapor deposition at 410° C. Other masking materials may be used. The mask may be patterned using standard photolithography techniques and etched in a buffered HF solution. In one embodiment, the openings are 3 µm-wide openings that extend in parallel at distances of between 3 and 40 µm and that are oriented along the <1$\bar{1}$00> direction on the lateral gallium nitride layer 108a. Prior to further processing, the structure may be dipped in a 50% hydrochloric acid (HCl) solution to remove surface oxides. It will be understood that although the mask 206 is preferably located above the posts 106, it can also be offset therefrom.

Figure 7:
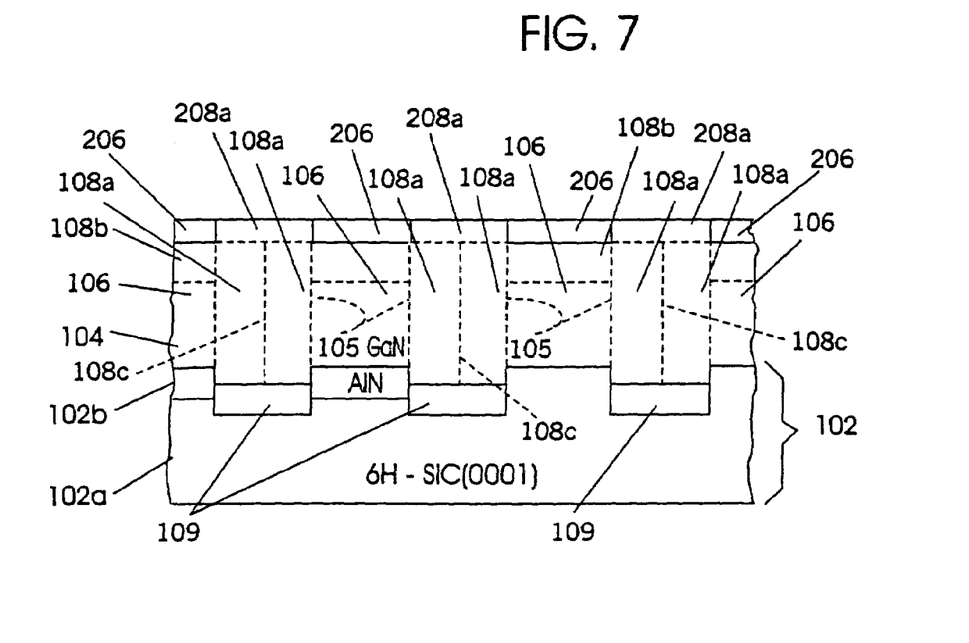

Referring now to FIG. 7, the lateral gallium nitride semiconductor layer 108a is grown through the array of openings to form a vertical gallium nitride layer 208a in the openings. Growth of gallium nitride may be obtained, as was described in connection with FIG. 2.

It will be understood that growth in two dimensions may be used to form an overgrown gallium nitride semiconductor layer. Specifically, the mask 206 may be patterned to include an array of openings that extend along two orthogonal directions such as <1$\bar{1}$00> and <11$\bar{2}$0>. Thus, the openings can form a rectangle of orthogonal striped patterns. In this case, the ratio of the edges of the rectangle is preferably proportional to the ratio of the growth rates of the {11$\bar{2}$0} and {1$\bar{1}$01} facets, for example, in a ratio of 1.4:1. The openings can be equitriangular with respect to directions such as <1$\bar{1}$00> and <11$\bar{2}$0>.

Figure 8:
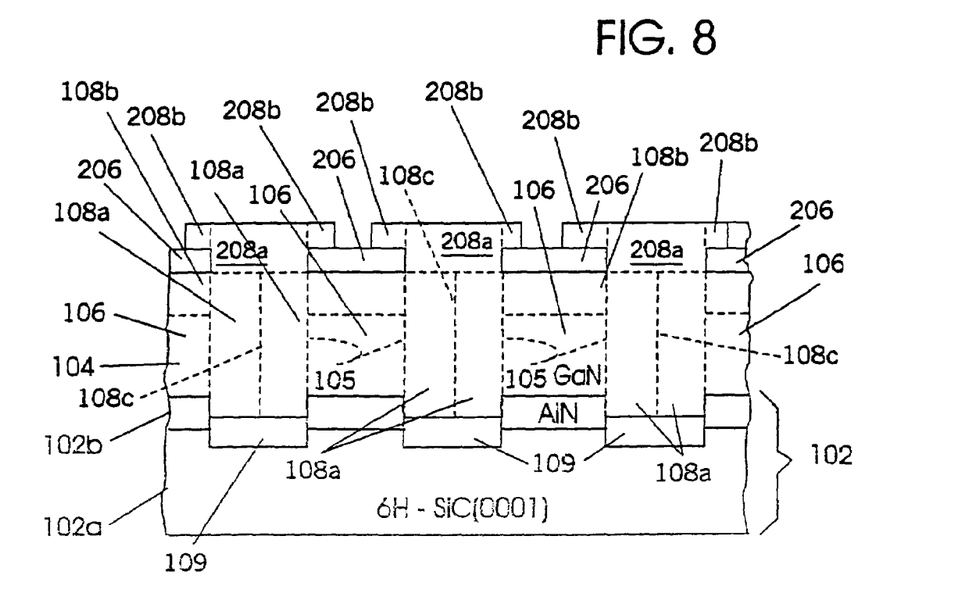

Referring now to FIG. 8, continued growth of the vertical gallium nitride layer 208a causes lateral growth onto the mask 206, to form a second lateral gallium nitride layer 208b. Conditions for overgrowth may be maintained as was described in connection with FIG. 7.

Figure 9:
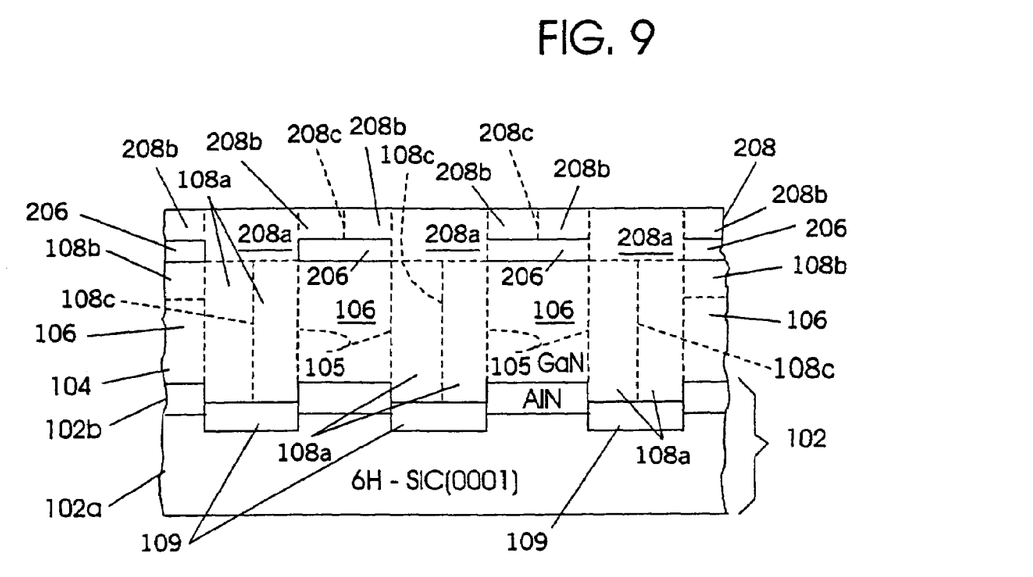
Figure 10:
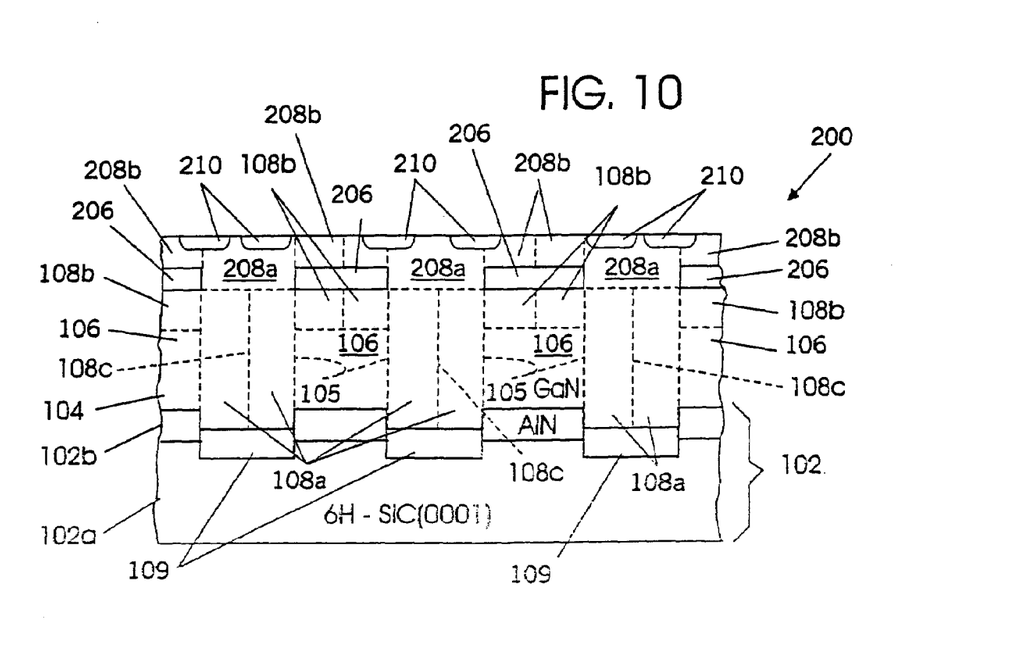
Figure 11:
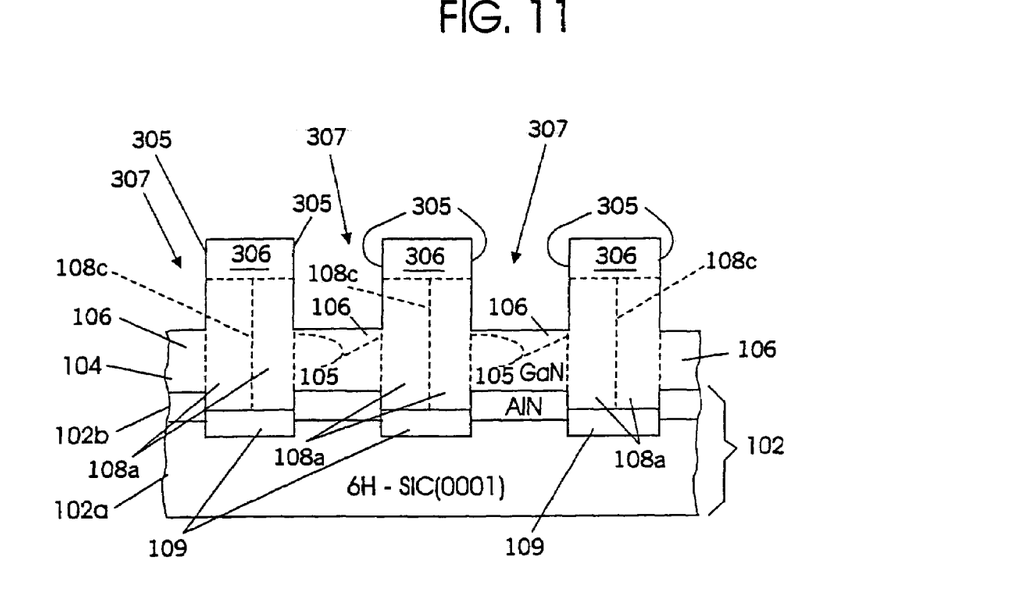
FIGS. 11–15 are cross-sectional views of third embodiments of gallium nitride semiconductor structures during intermediate fabrication steps according to the present invention.

Referring now to FIG. 9, lateral overgrowth is allowed to continue until the lateral growth fronts coalesce at the second interfaces 208c on the mask 206 to form a continuous overgrown gallium nitride semiconductor layer 208. The total growth time may be approximately sixty minutes. As shown in FIG. 10, microelectronic devices 210 may then be formed in the second lateral gallium nitride layer 208b. The microelectronic devices may also be formed in the vertical gallium nitride layer 208a.

Accordingly, by providing the second lateral growth layer 208b, defects that were present in continuous gallium nitride semiconductor layer 108 may be reduced even further, to obtain device quality gallium nitride in the gallium nitride semiconductor structure 200.

Referring now to FIGS. 11–15, third embodiments of gallium nitride semiconductor structures and fabrication methods according to the present invention will now be described. First, gallium nitride semiconductor structures of FIG. 4 are fabricated as was already described in connection with FIGS. 1–4. Then, a plurality of second sidewalls 305 are formed. The second sidewalls 305 may be formed by selective epitaxial growth of second posts 306 by etching second trenches 307 in the first posts 106 and/or combinations thereof. As was already described, the second sidewalls 305 need not be orthogonal to substrate 102, but rather may be oblique. The second trenches 307 need not be directly over the first posts 106, but may be laterally offset therefrom. The second trenches are preferably deep so that lateral growth preferentially occurs on the sidewalls 305 rather than on the bottom of second trenches 306.

Figure 12:
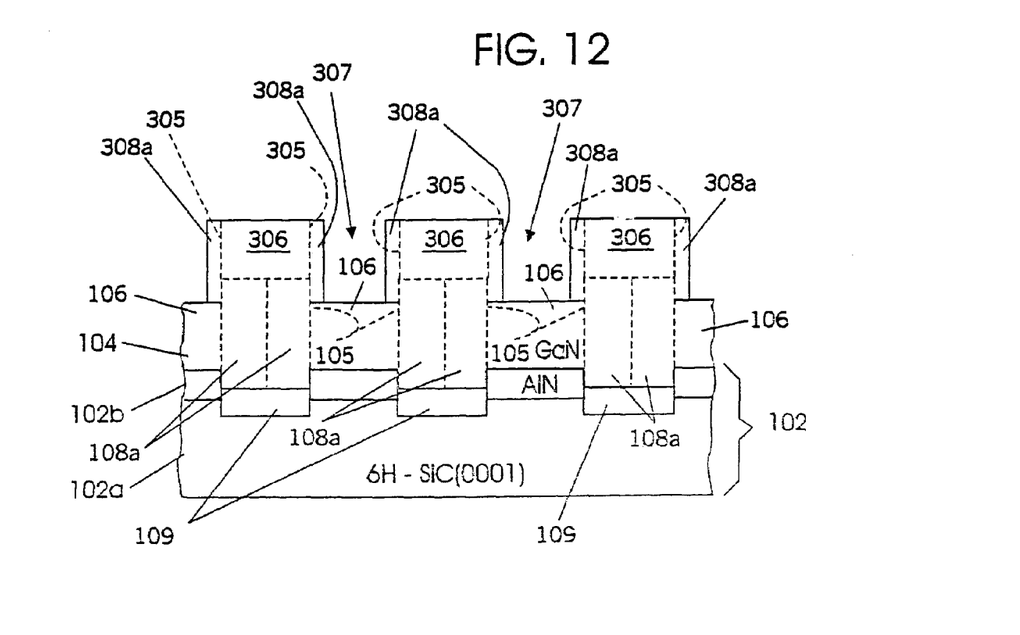

Referring now to FIG. 12, the second sidewalls 305 of the second posts 306 and/or the second trenches 307 are laterally grown to form a second lateral gallium nitride layer 308a in the second trenches 307. As was already described, lateral growth of gallium nitride may be obtained at 1000–1100° C. and 45 Torr. The precursors TEG at 13–39 µmol/min and NH$_3$ at 1500 sccm may be used in combination with a 3000 sccm H$_2$ diluent. If gallium nitride alloys are formed, additional conventional precursors of aluminum or indium, for example, may also be used. It will also be understood that some vertical growth may take place on the second posts 306 during the lateral growth from the second sidewalls 305.

Figure 13:
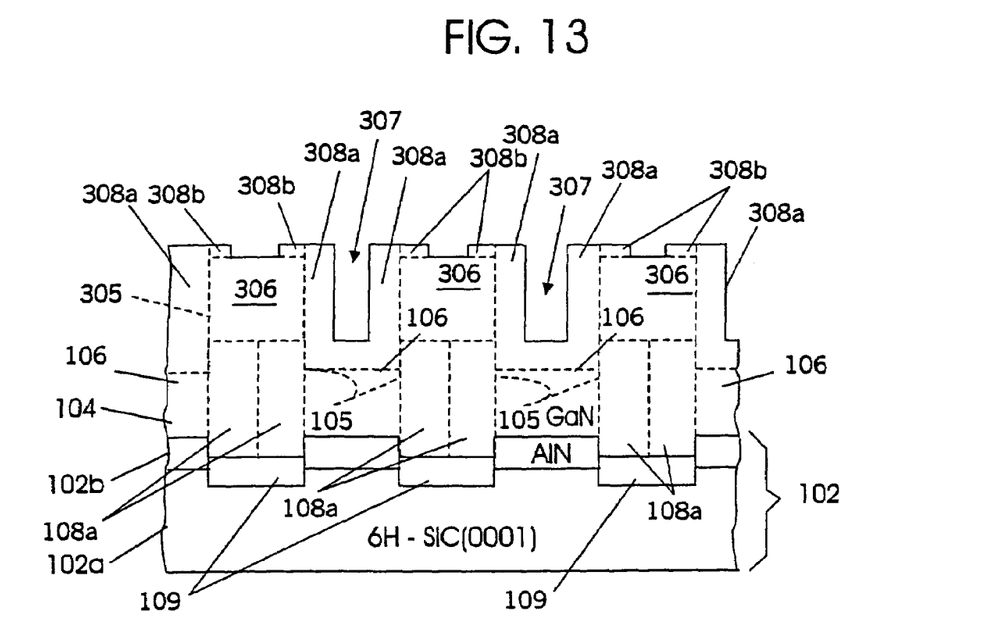

Referring now to FIG. 13, continued growth of the second lateral gallium nitride layer 308a causes vertical growth onto the second posts 306, to form a second vertical gallium nitride layer 308b. As also shown, vertical growth from the floors of the second trenches and from the tops of the second posts may also take place. Growth conditions for vertical growth may be maintained as was described in connection with FIG. 12.

Figure 14:
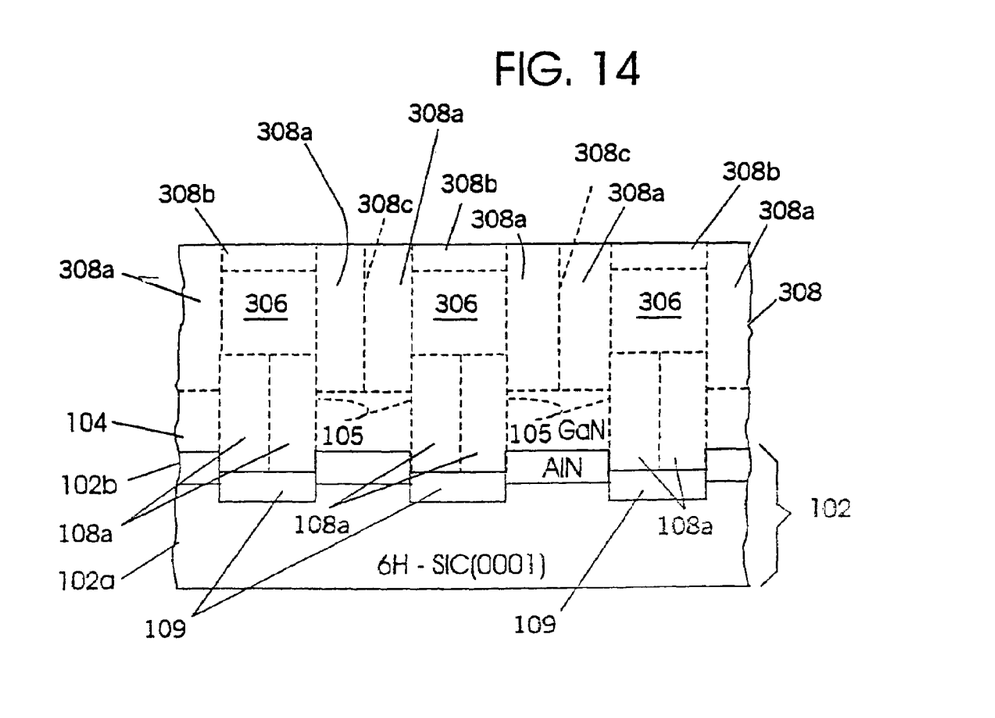
Figure 15:
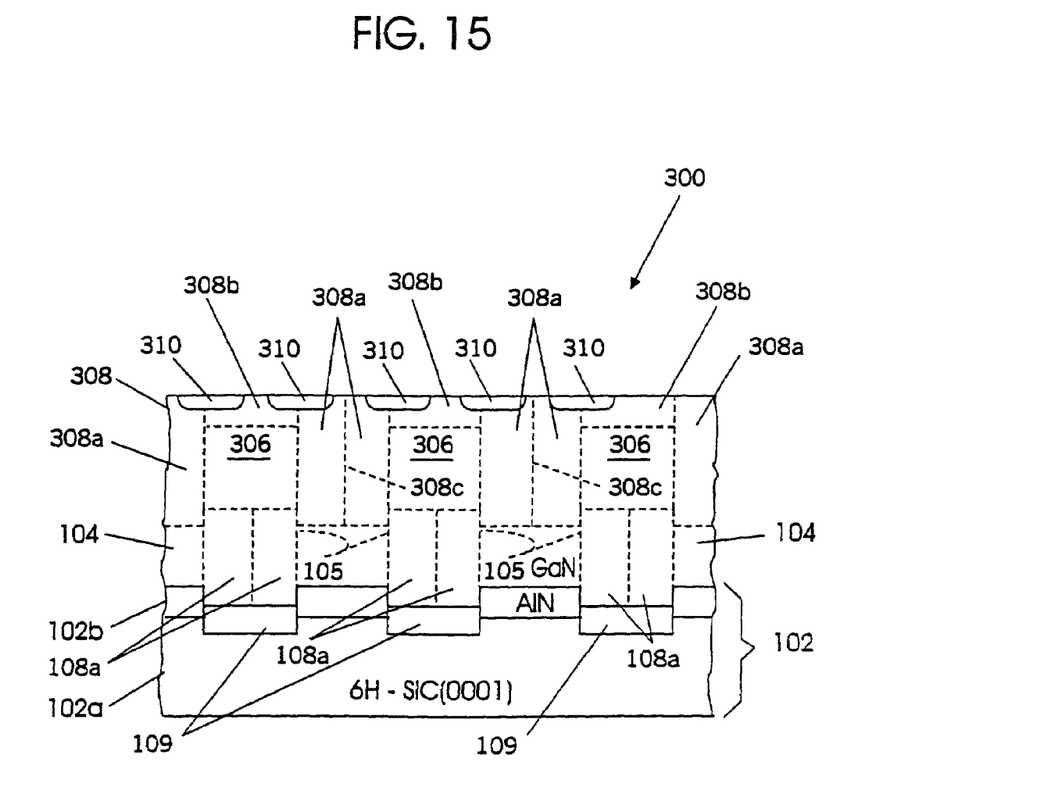

Referring now to FIG. 14, growth is allowed to continue until the lateral growth fronts coalesce in the second trenches 307 at the second interfaces 308c to form a second continuous gallium nitride semiconductor layer 308. The total growth time may be approximately sixty minutes. As shown in FIG. 15, microelectronic devices 310 may then be formed in the second continuous gallium nitride semiconductor layer 308.

Accordingly, third embodiments of gallium nitride semiconductor structures 300 according to the present invention may be formed without the need to mask gallium nitride for purposes of defining lateral growth. Rather, lateral growth from first and second sidewalls may be used. By performing two separate lateral growths, the defect density may be reduced considerably.

Additional discussion of methods and structures of the present invention will now be provided. The first and second trenches 107 and 307 and the openings in the mask 206 are preferably rectangular trenches and openings that preferably extend along the <11$\bar{2}$0> and/or <1$\bar{1}$00> directions on the underlying gallium nitride layer 104 or the first lateral gallium nitride layer 108a. Truncated triangular stripes having (1$\bar{1}$01) slant facets and a narrow (0001) top facet may be obtained for trenches and/or mask openings along the <11$\bar{2}$0> direction. Rectangular stripes having a (0001) top facet, (11$\bar{2}$0) vertical side faces and (1$\bar{1}$01) slant facets may be grown along the <1$\bar{1}$00> direction. For growth times up to 3 minutes, similar morphologies may be obtained regardless of orientation. The stripes develop into different shapes it the growth is continued.

The amount of lateral growth generally exhibits a strong dependence on trench and/or mask opening orientation. The lateral growth rate of the <1$\bar{1}$00> oriented trenches and/or mask openings is generally much faster than those along <11$\bar{2}$0>. Accordingly, it is most preferred to orient the trenches and/or mask openings, so that they extend along the <1$\bar{1}$00> direction of the underlying gallium nitride layer 104 or the first lateral gallium nitride layer 108a.

The different morphological development as a function of trench and/or mask opening orientation appears to be related to the stability of the crystallographic planes in the gallium nitride structure. Trenches and/or mask openings oriented along <11$\bar{2}$0> may have wide (1$\bar{1}$00) slant facets and either a very narrow or no (0001) top facet depending on the growth conditions. This may be because (1$\bar{1}$01) is the most stable plane in the gallium nitride wurtzite crystal structure, and the growth rate of this plane is lower than that of others. The {1$\bar{1}$01} planes of the <1$\bar{1}$00> oriented trenches and/or mask openings may be wavy, which implies the existence of more than one Miller index. It appears that competitive growth of selected {1$\bar{1}$01} planes occurs during the deposition which causes these planes to become unstable and which causes their growth rate to increase relative to that of the (1$\bar{1}$01) of trenches and/or mask openings oriented along <11$\bar{2}$0>.

The morphologies of the gallium nitride layers selectively grown from trenches and/or mask openings oriented along <1$\bar{1}$00> are also generally a strong function of the growth temperatures. Layers grown at 1000° C. may possess a truncated triangular shape. This morphology may gradually change to a rectangular cross-section as the growth temperature is increased. This shape change may occur as a result of the increase in the diffusion coefficient and therefore the flux of the gallium species along the (0001) top plane onto the {1$\bar{1}$01} planes with an increase in growth temperature. This may result in a decrease in the growth rate of the (0001) plane and an increase in that of the {1$\bar{1}$01}. This phenomenon has also been observed in the selective growth of gallium arsenide on silicon dioxide. Accordingly, temperatures of 1100° C. appear to be most preferred.

The morphological development of the gallium nitride regions also appears to depend on the flow rate of the TEG. An increase in the supply of TEG generally increases the growth rate in both the lateral and the vertical directions. However, the lateral/vertical growth rate ratio decrease from 1.7 at the TEG flow rate of 13 μmol/min to 0.86 at 39 μmol·min. This increased influence on growth rate along <0001> relative to that of <11$\bar{2}$0> with TEG flow rate may be related to the type of reactor employed, wherein the reactant gases flow vertically and perpendicular to the substrate. The considerable increase in the concentration of the gallium species on the surface may sufficiently impede their diffusion to the {1$\bar{1}$01} planes such that chemisorption and gallium nitride growth occur more readily on the (0001) plane.

Continuous 2 μm thick gallium nitride semiconductor layers may be obtained Using 3 μm wide trenches and/or mask openings spaced 7 μm apart and oriented along <1$\bar{1}$00>, at 1100° C. and a TEG flow rate of 26 μmol/min. The continuous gallium nitride semiconductor layers may include subsurface voids that form when two growth fronts coalesce. These voids may occur most often using lateral growth conditions wherein rectangular trenches and/or mask openings having vertical {11$\bar{2}$0} side facets developed.

The continuous gallium nitride semiconductor layers may have a microscopically flat and pit-free surface. The surfaces of the laterally grown gallium nitride layers may include a terrace structure having an average step height of 0.32 nm. This terrace structure may be related to the laterally grown gallium nitride, because it is generally not included in much larger area films grown only on aluminum nitride buffer layers. The average RMS roughness values may be similar to the values obtained for the underlying gallium nitride layer 104.

Threading dislocations, originating from the interface between the underlying gallium nitride layer 104 and the buffer layer 102b, appear to propagate to the top surface of the underlying gallium nitride layer 104. The dislocation density within these regions is approximately $10^9$ cm$^{-2}$. By contrast, threading dislocations do not appear to readily propagate laterally. Rather, the lateral gallium nitride regions 108a and 308a contain only a few dislocations. These few dislocations may be formed parallel to the (0001) plane via the extension of the vertical threading dislocations after a 90° bend in the regrown region. These dislocations do not appear to propagate to the top surface of the overgrown gallium nitride layer.

As described, the formation mechanism of the selectively grown gallium nitride layers is lateral epitaxy. The two main stages of this mechanism are vertical growth and lateral growth. During vertical growth through a mask, the deposited gallium nitride grows selectively within the mask openings more rapidly than it grows on the mask, apparently due to the much higher sticking coefficient, s, of the gallium atoms on the gallium nitride surface (s=1) compared to on the mask (s<<1). Since the $SiO_2$ bond strength is 799.6 kJ/mole and much higher than that of Si—N (439 kJ/mole), Ga—N (103 kJ/mole), and Ga—O (353.6 kJ/mole), Ga or N atoms should not readily bond to the mask surface in numbers and for a time sufficient to cause gallium nitride nuclei to form. They would either evaporate or diffuse along the mask surface to the opening in the mask or to the vertical gallium nitride surfaces which have emerged. During lateral growth, the gallium nitride grows simultaneously both vertically and laterally.

Surface diffusion of gallium and nitrogen on the gallium nitride may play a role in gallium nitride selective growth. The major source of material appears to be derived from the gas phase. This may be demonstrated by the fact that an increase in the TEG flow rate causes the growth rate of the (0001) top facets to develop faster than the ($1\bar{1}01$) side facets and thus controls the lateral growth.

The laterally grown gallium nitride bonds to the underlying mask sufficiently strongly so that it generally does not break away on cooling. However, lateral cracking within the $SiO_2$ mask may take place due to thermal stresses generated on cooling. The viscosity ($\rho$) of the $SiO_2$ at 1050° C. is about $10^{15.5}$ poise which is one order of magnitude greater than the strain point (about $10^{14.5}$ poise) where stress relief in a bulk amorphous material occurs within approximately six hours. Thus, the $SiO_2$ mask may provide limited compliance on cooling. As the atomic arrangement on the amorphous $SiO_2$ surface is quite different from that on the GaN surface, chemical bonding may occur only when appropriate pairs of atoms are in close proximity. Extremely small relaxations of the silicon and oxygen and gallium and nitrogen atoms on the respective surfaces and/or within the bulk of the $SiO_2$ may accommodate the gallium nitride and cause it to bond to the oxide. Accordingly, the embodiments of FIGS. 1–5 and 11–15, which need not employ a mask, may be particularly advantageous.

In conclusion, lateral epitaxial overgrowth may be obtained from sidewalls of an underlying gallium nitride layer via MOVPE. The growth may depend strongly on the sidewall orientation, growth temperature and TEG flow rate. Coalescence of overgrown gallium nitride regions to form regions with both extremely low densities of dislocations and smooth and pit-free surfaces may be achieved through 3 μm wide trenches between 7 μm wide posts and extending along the <$1\bar{1}00$> direction, at 1100° C. and a TEG flow rate of 26 μmol/min. The lateral overgrowth of gallium nitride from sidewalls via MOVPE may be used to obtain low defect density regions for microelectronic devices, without the need to use masks.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A method of fabricating a gallium nitride semiconductor layer comprising the steps of:
   forming a gallium nitride layer on a substrate;
   etching a trench in the gallium nitride layer; and then
   laterally growing the gallium nitride layer into the trench in the gallium nitride layer to thereby form a lateral gallium nitride semiconductor layer.

2. A method according to claim 1 wherein the laterally growing step is followed by the step of forming at least one microelectronic device in the lateral gallium nitride semiconductor layer.

3. A method according to claim 1 wherein the laterally growing step comprises the step of laterally growing the gallium nitride layer using metalorganic vapor phase epitaxy.

4. A method according to claim 1 wherein the forming step comprises the steps of:
   forming a buffer layer on a substrate; and
   forming the gallium nitride layer on the buffer layer opposite the substrate.

5. A method according to claim 1 wherein the gallium nitride layer includes a defect density, and wherein the laterally growing step comprises the steps of:
   laterally growing the gallium nitride layer to thereby form the lateral gallium nitride semiconductor layer of lower defect density than the defect density; and
   vertically growing the lateral gallium nitride semiconductor layer while propagating the lower defect density.

6. A method according to claim 1 wherein the laterally growing step comprises the step of laterally growing the gallium nitride layer using metalorganic vapor phase epitaxy of triethylgallium at 13–39 μmol/min and ammonia at 1500 sccm at a temperature of 1000° C.–1100° C.

7. A method according to claim 1 wherein the step of etching the trench in the gallium nitride layer comprises the step of etching the trench in the gallium nitride layer, extending into the gallium nitride layer but not into the substrate.

8. A method according to claim 4 wherein the step of etching the trench in the gallium nitride layer comprises the step of etching the trench in the gallium nitride layer, extending into the gallium nitride layer but not into the buffer layer.

9. A method according to claim 4 wherein the step of etching the trench in the gallium nitride layer comprises the step of etching the trench in the gallium nitride layer, extending into the gallium nitride layer and into the buffer layer but not into the substrate.

10. A method according to claim 4 wherein the step of etching the trench in the gallium nitride layer comprises the step of etching the trench in the gallium nitride layer, extending into the gallium nitride layer, into the buffer layer and into the substrate.

* * * * *